(12) United States Patent
Nazarian et al.

(10) Patent No.: US 9,347,799 B2
(45) Date of Patent: May 24, 2016

(54) MAGNETIC FIELD SENSOR SYSTEM WITH A MAGNETIC WHEEL ROTATABLE AROUND A WHEEL AXIS AND WITH MAGNETIC SENSOR ELEMENTS BEING ARRANGED WITHIN A PLANE PERPENDICULAR TO THE WHEEL AXIS

(71) Applicant: NXP B.V., Eindhoven (NL)

(72) Inventors: Alexé Levan Nazarian, Eindhoven (NL); Frederik Willem Maurits Vanhelmont, Maaseik (BE); Jacobus Josephus Maria Ruigrok, Asten (NL)

(73) Assignee: NXP B.V., Eindhoven (NL)

( * ) Notice: Subject to any disclaimer, the term of this patent is extended or adjusted under 35 U.S.C. 154(b) by 143 days.

(21) Appl. No.: 14/177,994

(22) Filed: Feb. 11, 2014

(65) Prior Publication Data

US 2014/0232379 A1  Aug. 21, 2014

(30) Foreign Application Priority Data

Feb. 20, 2013 (EP) .................................... 13155906

(51) Int. Cl.
*G01B 7/14* (2006.01)
*G01R 33/09* (2006.01)
*G01D 5/14* (2006.01)

(52) U.S. Cl.
CPC ................ *G01D 5/147* (2013.01); *G01D 5/145* (2013.01); *G01R 33/09* (2013.01)

(58) Field of Classification Search
CPC ......... G01D 5/145; G01D 5/147; G01R 33/09
USPC ............................ 324/207.21, 252; 338/32 R
See application file for complete search history.

(56) References Cited

U.S. PATENT DOCUMENTS

| | | | | | |
|---|---|---|---|---|---|
| 4,506,217 | A | * | 3/1985 | Rothley et al. | ........... 324/207.21 |
| 5,585,719 | A | * | 12/1996 | Endo | ........................ G01P 3/486 |
| | | | | | 324/174 |

(Continued)

FOREIGN PATENT DOCUMENTS

| | | |
|---|---|---|
| DE | 100 56 515 A1 | 5/2001 |
| DE | 10 2010 020027 A1 | 5/2011 |
| EP | 0 419 040 A1 | 3/1991 |

OTHER PUBLICATIONS

Extended European Search Report for EP Patent Appln. No. 13155906.4 (Aug. 7, 2013).

*Primary Examiner* — Reena Aurora

(57) ABSTRACT

It is described a magnetic field differential sensor system for measuring rotational movements of a shaft. The described magnetic field sensor system (200) comprises (a) a biasing magnet (210, 510) configured for generating a biasing magnetic field; (b) a magnetic wheel (230) having a wheel axis and a circumferential surface which comprises a regular structure of teeth (231) and gaps (232) arranged in an alternating manner, wherein (i) the magnetic wheel (230) is attachable to the shaft and (ii) the magnetic wheel (230) can be magnetized by the biasing magnetic field; and (c) a magnetic sensor arrangement (220) comprising four magnetic sensor elements (221, 222, 223, 224) being connected with each other in a Wheatstone bridge configuration. Respectively two of the magnetic sensor elements (221, 222, 223, 224) are assigned to one half bridge of the Wheatstone bridge. Further, the four magnetic sensor elements (221, 222, 223, 224) are arranged within an y-z plane, wherein an x-axis, a y-axis and a z-axis define an orthogonal Cartesian coordinate system in which (i) the x-axis is oriented parallel with the wheel axis of the magnetic wheel (230), (ii) the y-axis is oriented tangential to the circumferential surface of the magnetic wheel (230), and (iii) the z-axis is the symmetry line through the center of the biasing magnet (210, 510) and the center of the magnetic wheel (230). The magnetic sensor elements can be hall sensor elements or magnetoresistive sensor elements (221, 222, 223, 224).

16 Claims, 6 Drawing Sheets

(56) References Cited

U.S. PATENT DOCUMENTS

| | | |
|---|---|---|
| 6,366,079 B1 | 4/2002 | Uenoyama |
| 7,141,967 B2 | 11/2006 | Butzmann |
| 8,354,840 B2 | 1/2013 | Shimauchi et al. |
| 9,103,657 B2 * | 8/2015 | Ruigrok et al. |
| 2005/0007105 A1 | 1/2005 | Siegle et al. |
| 2006/0261801 A1 | 11/2006 | Busch |

* cited by examiner

MAGNETIC FIELD SENSOR SYSTEM WITH A MAGNETIC WHEEL ROTATABLE AROUND A WHEEL AXIS AND WITH MAGNETIC SENSOR ELEMENTS BEING ARRANGED WITHIN A PLANE PERPENDICULAR TO THE WHEEL AXIS

CROSS-REFERENCE TO RELATED APPLICATIONS

This application claims the priority under 35 U.S.C. §119 of European patent application no. 13155906.4, filed on Feb. 20, 2013, the contents of which are incorporated by reference herein.

FIELD OF THE INVENTION

The present invention generally relates to the technical field of magnetic field sensors. In particular, the present invention relates to a magnetic field sensor system comprising a biasing magnet, an encoded soft magnetic wheel having a teeth structure and magnetic sensor elements, which with the help of an appropriate evaluation electronic are capable of determining positional information of the encoded soft-magnetic wheel.

BACKGROUND OF THE INVENTION

Magnetic sensors are increasingly important in various industries. For instance in the automotive industry various sensors such as parking sensors, angular sensors e.g. in throttle valves, ABS (Automatic Braking System) sensors and tire pressure sensors can be found in modern vehicles for improving comfort and safety. Magnetic sensors are particularly important in automotive applications, because magnetic fields penetrate easily through most materials. Magnetic sensors are also highly insensitive to dirt, unlike for example optical sensors.

Several different magnetic sensor technologies are currently available, such as magneto transistors (MT), sensors based on the Hall Effect and sensors based on the magnetoresistive effect such as anisotropic magnetoresistive (AMR) and giant magnetoresistive (GMR) sensors. The sensing principle of AMR sensors is based on the physical phenomenon that the electric resistance of a ferromagnetic material depends on the angle between the magnetization and the direction of the electric current within an AMR sensing element. Hall sensors and MTs, which rely on the Lorentz force, have a comparatively low sensitivity and consequently also a low accuracy. AMR sensors, while having a much higher sensitivity compared to Hall effect sensors and MTs, require more fabrication steps because they cannot easily be integrated monolithically, making a total sensor system more expensive.

GMR sensors typically have a higher sensitivity than AMR sensors. However, a GMR sensor consists of various thin layers and critical interfaces. The technology required to fabricate such sensors is considerably more complicated and expensive. Furthermore, due to the thin multiple layers making up a GMR sensor, the operating temperature range is also limited. Therefore often AMR sensors are chosen as a good compromise in magnetic sensor applications.

U.S. Pat. No. 7,141,967 B2 discloses a magnetic field sensor system for measuring the angular speed of a soft magnetic (gear) wheel attached for instance to the axis of a camshaft or crankshaft in a transmission system of a combustion engine. The disclosed magnetic field sensor system comprises a MR sensor arrangement consisting of four MR sensor elements which are electrically connected with each other in a so called Wheatstone bridge. The magnetic field sensor system further comprises a hard magnetic (permanent) magnet that produces a biasing magnetic field which magnetizes the wheel. In this respect soft magnetic means that the wheel has a high magnetic permeability and hard magnetic means that the magnet can be permanently magnetized. The hard magnet is predominately magnetized in a radial z-direction being oriented perpendicular to an x-y plane in which the four sensor elements are arranged. A periodic teeth-gap structure of the soft magnetic wheel produces periodic magnetic field changes when the wheel rotates. Since the MR sensor arrangement is sensitive to the y-component (Hy) of the magnetic field (H), this periodicity is visible in the output of the magnetic field sensor system. This signal can be used for determining the position and speed of the (gear) wheel and therefore of the parts of e.g. an engine to which the magnetic (gear) wheel is mechanically connected.

The magnetic field sensor system known from U.S. Pat. No. 7,141,967 B2 has the disadvantage that it has a small sensitivity. Further, a strong external magnetic field may have a negative impact on the output signal and on the reliability of the magnetic field sensor system. A high sensitivity and an immunity to homogenous external magnetic fields are required in particular when the magnetic field sensor system is used for determining the position and/or the speed of a crankshaft sensor because the starter motor in a start-stop system is typically located in the neighborhood of the crankshaft.

There may be a need for providing a magnetic sensor concept which on the one hand has a high sensitivity and on the other hand exhibits a high immunity with respect to external magnetic fields.

OBJECT AND SUMMARY OF THE INVENTION

This need may be met by the subject matter according to the independent claim 1. Advantageous embodiments of the present invention are described by the dependent claims.

According to a first aspect of the invention there is provided a magnetic field sensor system for measuring rotational movements of a shaft. The provided magnetic field sensor system may be in particular a magnetic field differential sensor system The provided magnetic field sensor system comprises (a) a biasing magnet configured for generating a biasing magnetic field; (b) a magnetic wheel having a wheel axis and a circumferential surface which comprises a regular structure of teeth and gaps arranged in an alternating manner, wherein (i) the magnetic wheel is attachable to the shaft and (ii) the magnetic wheel can be magnetized by the biasing magnetic field; and (c) a magnetic sensor arrangement comprising four magnetic sensor elements being connected with each other in a Wheatstone bridge configuration. Respectively two of the magnetic sensor elements are assigned to one half bridge of the Wheatstone bridge. Further, the four magnetic sensor elements are arranged within an y-z plane, wherein an x-axis, a y-axis and a z-axis define an orthogonal Cartesian coordinate system in which (i) the x-axis is oriented parallel with the wheel axis of the magnetic wheel, (ii) the y-axis is oriented tangential to the circumferential surface of the magnetic wheel, and (iii) the z-axis is the symmetry line through the center of the biasing magnet and the center of the magnetic wheel.

The described magnetic field sensor system is based on the idea that when placing the magnetic sensor elements within a plane being oriented perpendicular to the wheel axis an extreme high sensitivity of the magnetic field sensor system can be achieved while still having a very good suppression of the influence of external homogeneous magnetic fields on an output signal of the magnetic field sensor system.

The described magnetic field sensor concept has the advantage that it works for any differential magnetic sensor having a large sensitivity in the y-z plane. Hence, like for anisotropic magnetoresistive (AMR) sensors, it also leads to convenient options for giant magnetoresistive (GMR) sensors, tunnel magnetoresistive (TMR) sensors and sensors based on magneto transistors (MT) for an absolute position and angle detection in magnetically-polluted environments. The described magnetic field sensor concept can also be realized with hall sensor elements.

According to a further embodiment of the invention the magnetic sensor elements are oriented in such a manner that a first and a second one of the four magnetic sensor elements are located at a first distance from the magnetic wheel and a third and a fourth one of the four magnetic sensor elements are located at a second distance from the magnetic wheel, wherein the first distance is larger than the second distance.

Descriptive speaking, the first magnetic sensor element and the second magnetic sensor element are positioned further away from the magnetic wheel than the third magnetic sensor element and the fourth magnetic sensor element. As a consequence, the influence of the magnetic wheel on the magnetic field being present at the respective magnetic sensor element is much smaller for the first and the second magnetic sensor element as compared to the third and the fourth magnetic sensor element.

In a good approximation for the first and the second magnetic sensor element a modulation of the total magnetic field at the position of the respective sensor element caused by a rotation of the magnetic field is negligible compared to the strength of the biasing magnetic field. In other words, a rotation of the magnetic wheel will only modulate the total magnetic field at the positions of the third and the fourth magnetic sensor element in a significant extend. As a consequence, when taking into account a proper circuitry for the above described Wheatstone bridge, the sensitivity of the described magnetic field sensor system will be much higher than the sensitivity of known magnetic field sensor systems, which are also immune to homogeneous external magnetic fields.

Specifically, the electric level of an electric node between the third and the forth magnetic sensor element will exhibit a comparatively strong modulation in response to a rotation of the magnetic wheel wherein the electric level of an electric node between the first and the second magnetic sensor element will stay approximately constant. Thereby, it is preferable if in accordance with the basic principles of a Wheatstone bridge (a) a first fixed voltage level is applied to an electric node between the first and the forth magnetic sensor element and (b) a second fixed voltage level is applied to an electric node between the second and the third magnetic sensor element. The first fixed voltage level may be e.g. 0 Volt and the second fixed voltage level may be e.g. 1 Volt.

According to a further embodiment of the invention the magnetic sensor elements are formed on a single substrate die and in particular on a single semiconductor die. This may provide the advantage that the magnetic sensor arrangement consisting of the four magnetic sensor elements can be produced by means of a common semiconductor manufacturing process. This allows realizing the described magnetic field sensor system in an effective way with respect to the production costs.

According to a further embodiment of the invention the magnetic sensor elements occupy an area smaller than 4 mm$^2$, preferably smaller than 2 mm$^2$ and more preferably smaller than 1 mm$^2$. This may provide the advantage that the production costs for the single substrate or semiconductor die and, as a consequence also for the whole magnetic field sensor system, can be kept small.

According to an embodiment of the invention a direction of a magnetization of the biasing magnet is oriented parallel to the x-z plane. This may provide the advantage that when the magnetic wheel is in a symmetric angular position, the output signal provided by the magnetic field sensor system is zero. With this characteristic of the described magnetic field sensor system an important requirement for a sensor being suitable for measuring e.g. the rotational speed and/or the rotational position of a crankshaft of a combustion engine can be fulfilled In this respect "symmetric angular position" may mean that with respect to a circumferential direction of the magnetic wheel the center of a tooth or the center of a gap coincides with the z-axis. In other words, the term "symmetric angular position" may mean that a gap or a tooth of the magnetic wheel is located exactly and symmetrically between the biasing magnet and the wheel axis.

According to a further embodiment of the invention the biasing magnet has a side face being oriented perpendicular to the x-axis. Further, the magnetic sensor elements are placed at the side face of that biasing magnet. This may provide the advantage that the magnetic sensor elements can be easily mechanically supported by the biasing magnet. There is no need for any further mechanical structures being used for carrying and/or supporting the magnetic sensor elements at their respective spatial position.

The magnetic sensor elements may be attached to the biasing magnet in any possible manner. In particular, the magnetoresistive sensor elements may be glued to the side face of the biasing magnet.

According to a further embodiment of the invention the magnetic sensor elements are magnetoresistive sensor elements and the magnetic sensor arrangement is a magnetoresistive sensor arrangement. This may provide the advantage that the magnetic field sensor system can show an extreme high sensitivity while still being immune to external homogenous magnetic fields. The magnetoresistive sensor elements may be in particular AMR sensor elements.

According to a further embodiment of the invention the magnetoresistive sensor elements are oriented in such a manner that their easy axis of magnetization is oriented parallel to the direction of the local biasing magnetic field. This may provide the advantage that a disturbing influence of external homogenous magnetic (stray) fields can be perfectly suppressed while a very good sensitivity of the described magnetic field sensor system can be maintained.

In this respect "local biasing magnetic field" is the biasing magnetic field at the position of the respective magnetoresistive sensor element.

It is mentioned that the described orientation of the magnetoresistive sensor elements can be realized in particular if a longitudinal axis of the magnetoresistive sensor elements, which longitudinal axis defines the direction along which the magnetoresistive sensor elements have their longest extension, is oriented parallel to the direction of the biasing magnetic field.

According to a further embodiment of the invention the magnetoresistive sensor elements experience the same z-component of the biasing magnetic field. By selecting the magnetization direction and/or the spatial positions of the four magnetoresistive sensor elements in such a manner that at the locations of the four magnetoresistive sensor elements the z-component of the local biasing magnetic field is at least approximately the same, the immunity of the magnetic field sensor system to external homogenous magnetic field will be further increased.

According to a further embodiment of the invention the magnetoresistive sensor arrangement is located at a center of the side face of the biasing magnet. With such a configuration it may be very easy to place the magnetoresistive sensor elements at their proper positions. Thereby, it can be ensured that the above mentioned advantages (a) of a zero output when the magnetic wheel is in a symmetric position and/or (b) of an extended immunity against external homogenous fields can be easily achieved.

According to a further embodiment of the invention the direction of the magnetization of the biasing magnet is oriented exclusively parallel to the z-axis. This may mean in other words that the x- and the y-components of the magnetization are at least approximately zero. Thereby, the described magnetic field sensor system can be realized with a very simple geometry. It will not be necessary to orient the biasing magnet and/or the magnetization direction of the biasing magnet inclined or oblique with respect to any one of the three axes of the above mentioned Cartesian coordinate system of the described magnetic field sensor system.

According to a further embodiment of the invention the easy axis of magnetization of the magnetoresistive sensor elements is oriented exclusively parallel to the direction of the magnetization of the biasing magnet.

As has already been mentioned above the described orientation of the magnetoresistive sensor elements can be realized in particular if a longitudinal axis of the respective magnetoresistive sensor element, which longitudinal axis defines the direction along which the magnetoresistive sensor element has its longest extension, is oriented at least substantially parallel to the direction of the magnetization of the biasing magnet respectively to the z-axis.

According to a further embodiment of the invention the magnetoresistive sensor arrangement is located offset of a center of the side face of the biasing magnet. Depending on the spatial dimension of the magnetoresistive sensor arrangement and/or of the biasing magnet two of the magnetoresistive sensor elements can be located very close to the edge of (the respective side face of) the biasing magnet. Since the influence of the magnetic wheel onto the total local magnetic field at the locations of these two magnetoresistive sensor elements is particularly high, the sensitivity of the magnetic field sensor can be further improved.

According to a further embodiment of the invention the direction of the magnetization of the biasing magnet is oriented within the x-z plane, wherein an x-component of the magnetization is larger than zero. The x-component of the magnetization may make sure that the z-component of the biasing magnetic field stays the same for all four magnetoresistive sensor elements. Further, a stabilizing component of the biasing magnetic field can get smaller thus making the described magnetic field sensor system even more sensitive.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DESCRIPTION OF EMBODIMENTS

Figure 1:
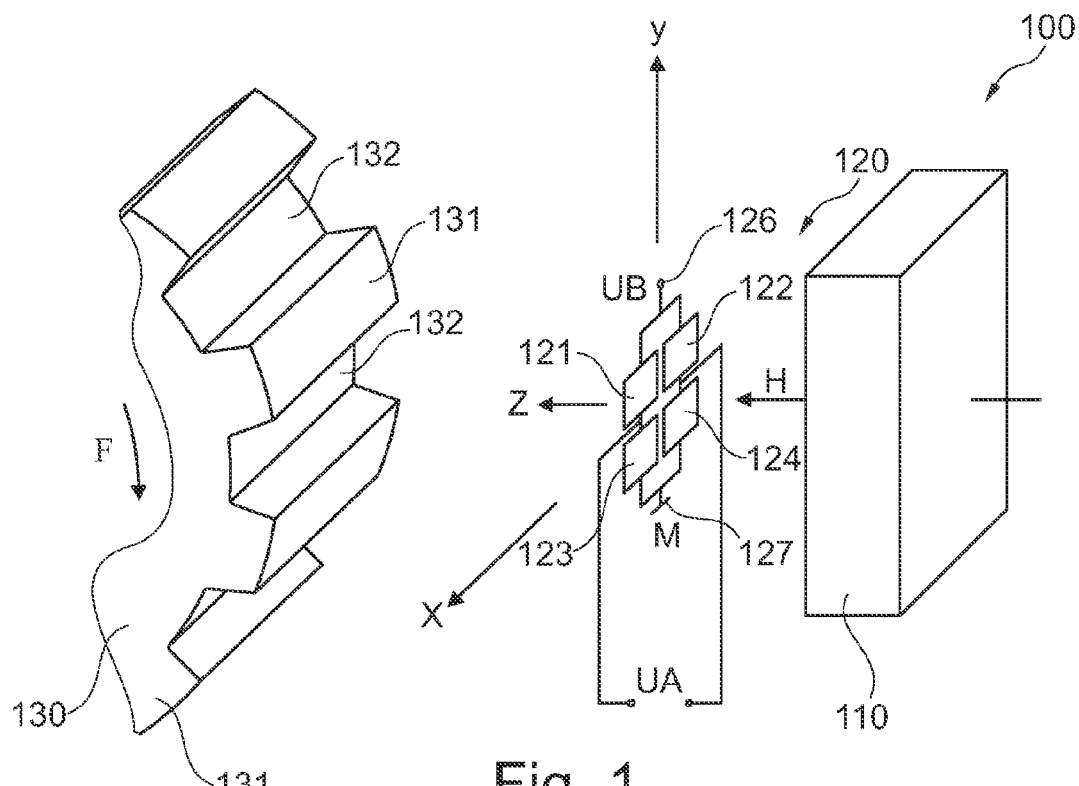
FIG. 1 shows a known magnetic field sensor system for illustrating the basic physical principles of sensing a rotational movement by means of a magnetoresistive sensor arrangement comprising four magnetoresistive sensor elements.

The illustration in the drawing is schematically. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

FIG. 1 shows a known magnetic field sensor system 100 for illustrating the basic physical principles of sensing a rotational movement by means of a magnetoresistive sensor arrangement 120 comprising four magnetoresistive sensor elements 121, 122, 123 and 124. As can be seen from FIG. 1, the magnetic field sensor system 100 comprises a biasing magnet 110 producing a biasing magnetic field H, the already mentioned magnetoresistive sensor arrangement 120 and an encoded soft magnetic wheel 130 having a circumferential surface which comprises a regular structure of teeth 131 and gaps 132 arranged in an alternating manner.

The magnetic wheel 130 can be attached to a not depicted shaft, e.g. a camshaft or a crankshaft in a transmission system of a combustion engine. This shaft is oriented along an x-direction. Its corresponding rotation is indicated in FIG. 1 with the curved arrow denominated with the rotational motion coordinate F.

The magnetoresistive sensor elements 121, 122, 123, 124, which are arranged on a not depicted silicon substrate (semiconductor die) in a meandering pattern, are configured as a Wheatstone bridge. This Wheatstone bridge is arranged between a first power supply terminal 126, to which in operation a first power supply potential UB is applied, and a second power supply terminal 127, to which in operation a second power supply potential M, preferably ground potential, is applied. The sensor arrangement 120 is planar arranged in an x-y plane defined by an x-axis and a y-axis of an orthogonal Cartesian system of coordinates. A z-axis of the Cartesian system is oriented perpendicular to the x-y plane.

The biasing magnet 110 has a rectangular geometry and is preferably stuck to a rear side of the sensor arrangement 120 or its housing so that the sensor arrangement 120 is permeated by the biasing magnetic field H. The magnetoresistive sensor arrangement 120 has a measuring direction along the y-axis. Along this measuring direction, it is sensitive to the polarity and the field strength of an external magnetic field and is adapted to supply a measuring signal in dependence upon a field component of this magnetic field, denoted as measuring field and measured in the measuring direction. For operation, the external magnetic field is preferably and exclusively formed by the magnetic field H of the biasing magnet 110.

To measure the rotational speed of a shaft by means of the magnetoresistive sensor arrangement 120, the encoded soft magnetic wheel 130 described hereinbefore is positioned in front of the sensor arrangement 120 in the direction of the z-axis. In operation the wheel 130 being formed from a ferromagnetic material which can be magnetized by the biasing magnetic field H rotates in the direction of the motion coordinate F. Along the motion coordinate F of the magnetic wheel 130, this leads to a distortion of the field lines of the biasing magnetic field H of the biasing magnet 110 in the measuring direction of the sensor arrangement 120, situated in the direction of the y-axis, which distortion occurs periodically with respect to the distance between the teeth 131 or the magnetic wheel 130. The field component of the magnetic field H of the measuring direction situated in the direction of the y-axis is denoted as measuring field.

In the magnetoresistive sensor arrangement 120, the measuring field generates a preferably at least substantially sinusoidal output signal UA via the motion coordinate F of the encoded soft magnetic wheel 130.

Figure 2:
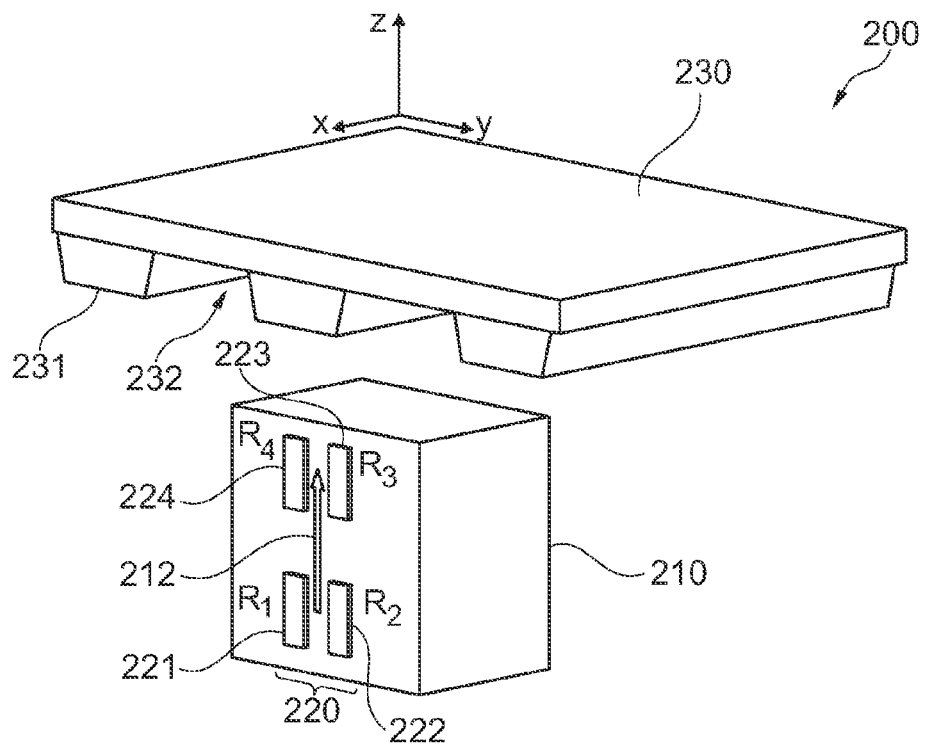
FIG. 2 shows in a perspective view a magnetic field sensor system, wherein in accordance with an embodiment of the invention a magnetoresistive sensor arrangement is located at a center of a side face of a biasing magnet.

FIG. 2 shows in a perspective view a magnetic field sensor system 200 according to an embodiment of the invention. The magnetic field sensor system 200 comprises a biasing magnet 210, an encoded soft magnetic wheel 230, and a magnetoresistive sensor arrangement 220, which is attached to a side surface of the biasing magnet 210.

According to the embodiment described here the biasing magnet 210 is made from a single permanent magnet which has a magnetization which in FIG. 2 is indicated by the arrow 212. However, the biasing magnet 210 may also be made from different magnet pieces. As can be seen from FIG. 2, according to the embodiment described here the direction of the magnetization 212 is oriented parallel to the z-axis.

The encoded soft magnetic wheel 230 has a circumferential surface which comprises a regular structure of teeth 231 and gaps 232, which are arranged in an alternating manner. In accordance with the magnetic field sensor system 100 shown in FIG. 1 also in the magnetic field sensor system 200 which is shown in FIG. 2 the circumferential surface of the soft magnetic wheel 230 facing the biasing magnet 210 moves along the y-axis. The rotational axis of the encoded soft magnetic wheel 230 is oriented parallel to the x-axis and in FIG. 2 is located above the depicted cutaway of the magnetic wheel 230.

The magnetoresistive sensor arrangement 220 comprises four magnetoresistive sensor elements 221, 222, 223 and 224. According to the embodiment described here the magnetoresistive sensor arrangement 220 is located at a center of a side face of the biasing magnet 210. Further, the magnetoresistive sensor elements 221, 222, 223 and 224 can be arranged in a meandering pattern.

It is mentioned that in FIG. 2 connections between the magnetoresistive sensor elements 221, 222, 223,224 to let them form a differential Wheatstone bridge and means for biasing and stabilization (e.g. barber poles of the magnetoresistive sensor elements 221, 222, 223, 224) are not shown for the sake of clarity of the illustration.

It is mentioned that the easy axis of magnetization of the magnetoresistive sensor elements 221, 222, 223,224 is the same as the longitudinal extension of the magnetoresistive sensor elements 221, 222, 223,224. This means that in the embodiment described here the easy axis of magnetization of the magnetoresistive sensor elements 221, 222, 223,224 is parallel to the z-axis.

Figure 3:
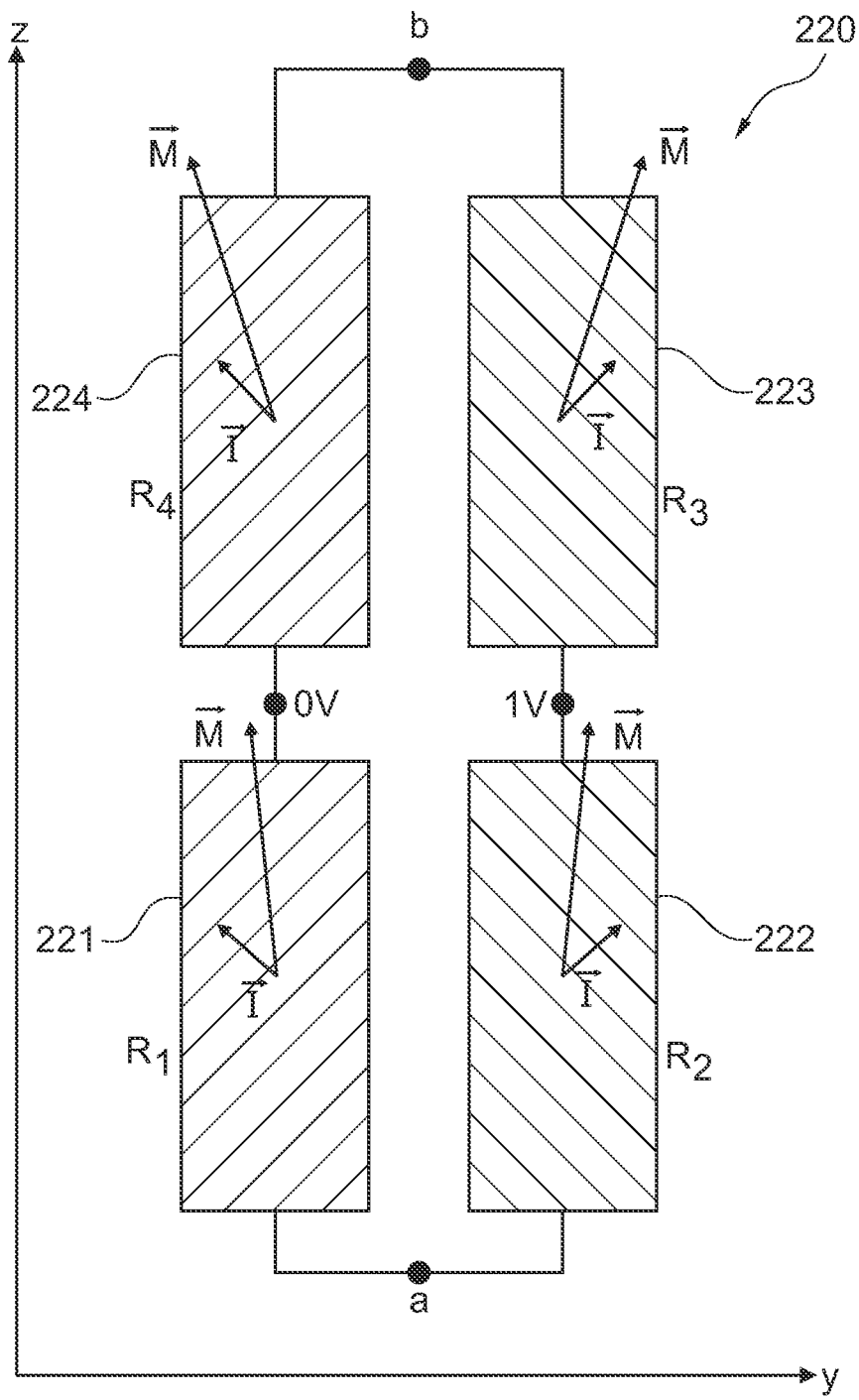
FIG. 3 shows for the magnetic field sensor system of FIG. 2 the used barberpole structure and the directions of the magnetizations and the currents in the magnetoresistive sensor elements, when the magnetic wheel is at a symmetrical position.

FIG. 3 shows for the magnetic field sensor system of FIG. 2 the used barberpole structure and the directions of the magnetizations M and the currents I in the magnetoresistive sensor elements 221, 222, 223 and 224, when the not depicted encoded soft magnetic wheel 230 (shown in FIG. 2) is at a symmetrical position.

In accordance with FIG. 2, the magnetization direction of the not depicted biasing magnet 210 (shown in FIG. 2) is parallel to the z-axis. However, the presence of the soft magnetic wheel leads to a perturbation of the direction of the magnetization M of the magnetoresistive sensor elements 221, 222, 223 and 224. As has already been mentioned above the two magnetoresistive sensor elements 221, 222 are located further away from the magnetic wheel as compared to the magnetoresistive sensor elements 223 and 224. Hence, the influence of the soft magnetic wheel on the magnetization of the magnetoresistive sensor elements 221, 222 is much smaller than the influence of the soft magnetic wheel on the magnetization of the magnetoresistive sensor elements 223 and 224. This is reflected in FIG. 3, where the angle between the z-axis and the magnetization directions M of the magnetoresistive sensor elements 223, 224 is larger than the angle between the z-axis and the magnetization directions M of the magnetoresistive sensor elements 221, 222.

In accordance with the physical principles of barber pole structures which in FIG. 3 are indicated with angular hatchings the main current directions I have a direction perpendicular to the direction of the barber poles. According to the embodiment described here the barber pole structures all form an angle of 45° with respect to the z-axis. Accordingly, the current direction within all magnetoresistive sensor elements 221, 222, 223 and 224 also forms an angle of 45° with respect to the z-axis.

From FIG. 3 it can be easily seen that in any symmetrical position of the magnetic wheel the magnetic field sensor system generates a zero output signal between a node a and a node b of the magnetoresistive sensor arrangement 220. Indeed, due to symmetry, the angles between magnetization M and current direction I in the lower magnetoresistive sensor elements 221 and 222 are equal. This means that electric resistances of these magnetoresistive sensor elements 221 and 222 are also equal. When the electric potential at the node between the magnetoresistive sensor elements 221 and 224 is fixed to 1 Volt and the electric potential at the node between the magnetoresistive sensor elements 222 and 223 is fixed to 0 Volt, the electric potential at the node a is 0.5 Volt. The same is true for the magnetoresistive sensor elements 222 and 223. This means that the electric potential at the node b is also 0.5 Volt. Since the output signal of the magnetic field sensor system is the potential difference V(b)–V(a), one can conclude that at any symmetrical position of the magnetic wheel the output of the magnetic field sensor system will be zero.

However, the described symmetry of the magnetoresistive sensor arrangement 220 does alone not cause a strong immunity of the magnetoresistive sensor arrangement to external magnetic fields. This immunity depends on the ratio between the magnetic field of the (passive) soft magnetic wheel and the magnetic field of the biasing magnet at the positions of the magnetoresistive sensor elements 221, 222, 223 and 224. In any realistic scenario this ratio cannot be bigger than ⅟₁₀₀.

Figure 4A:
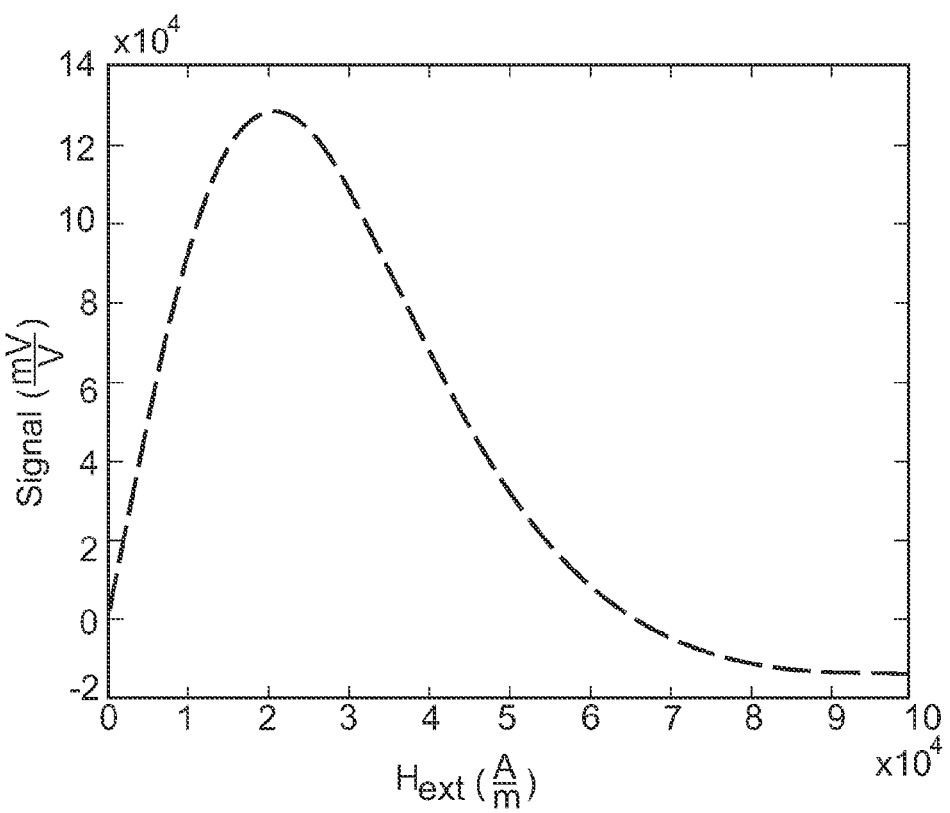
FIGS. 4a and 4b show the output signal of the magnetic field sensor system of FIG. 2 in a symmetrical position of the wheel as a function of an external magnetic field being directed parallel to the y-axis.
Figure 4B:
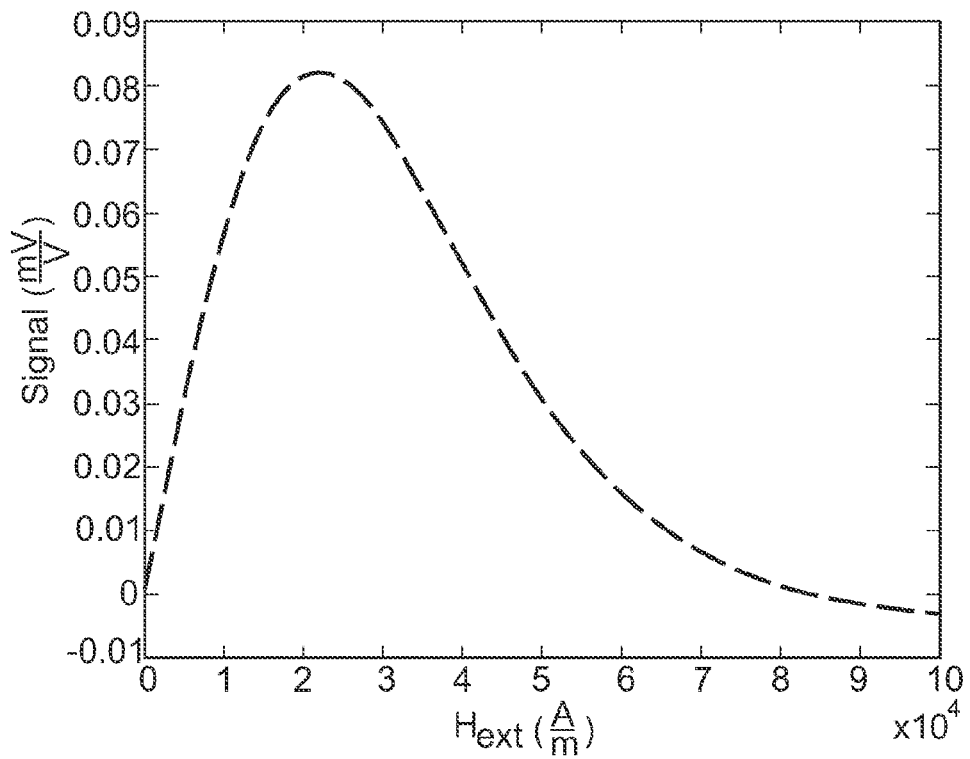

FIGS. 4a and 4b show the output signal of the magnetic field sensor system of FIG. 2 in a symmetrical position of the soft magnetic wheel as a function of an external magnetic field $H_{ext}$ being directed parallel to the y-axis. FIG. 4a shows the output signal when the ratio between the magnetic field of the passive magnetic wheel and the magnetic field of the bias magnet is 0.01. One can see that the output signal in a symmetrical position is too small to be distinguished from noise and will be considered as to be zero by a not depicted processing unit of the magnetic field sensor system. FIG. 4b shows that even in case the magnetic field of the soft magnetic wheel gets ⅟₁₀ of the biasing magnetic field of the biasing magnet at the positions of the magnetoresistive sensor elements 221, 222, 223 and 224, the output signal of the magnetic field sensor system cannot exceed 0.1 mV/V and will also be interpreted as to be zero.

Figure 5:
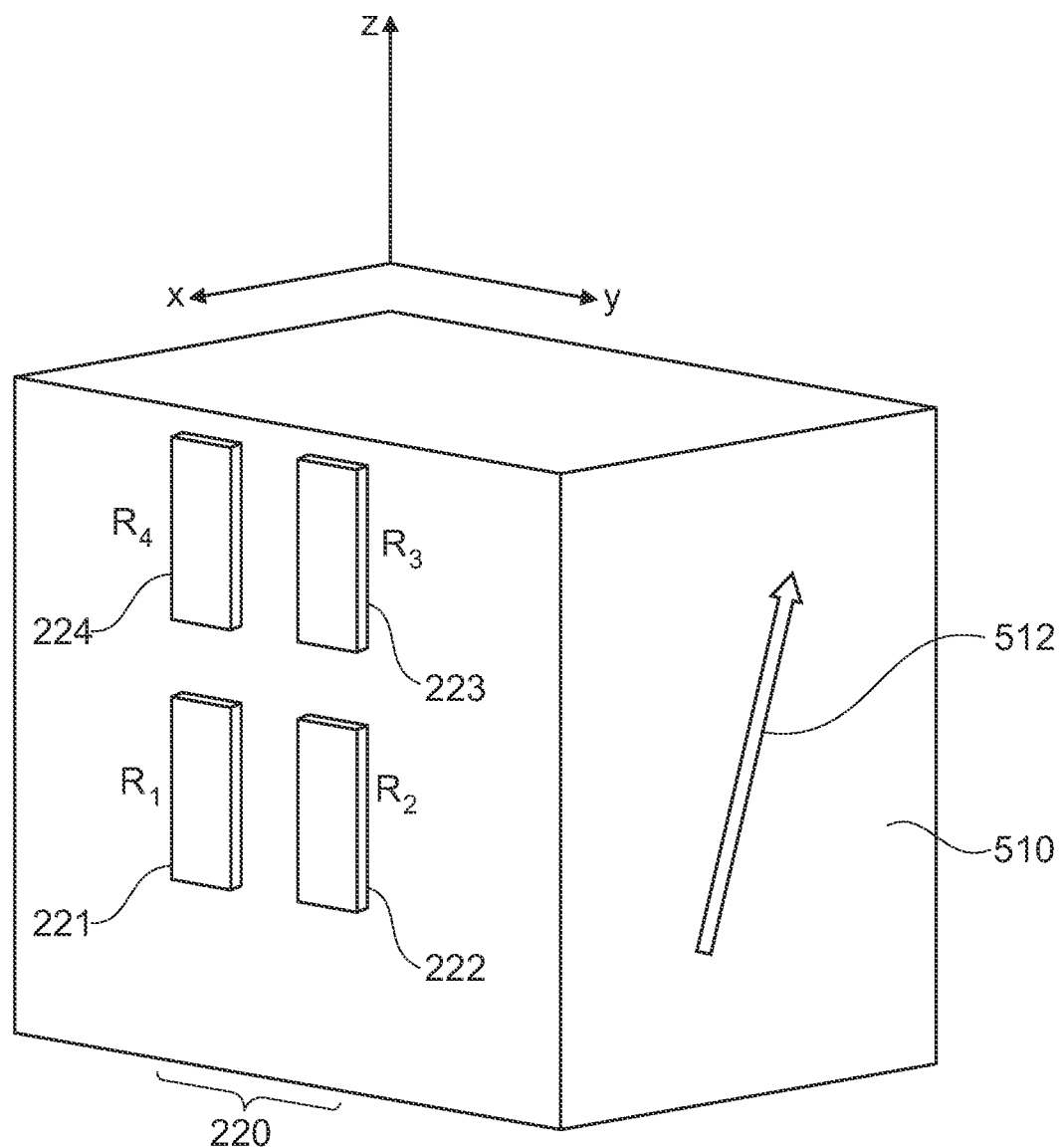
FIG. 5 shows in a perspective view a biasing magnet with a magnetoresistive sensor arrangement attached thereto, wherein in accordance with an embodiment of the invention the magnetoresistive sensor arrangement is located offset with respect to a center of a side face of a biasing magnet.

Calculations, which have been performed by the inventors of the magnetic field sensor systems described in this document, show that a strong immunity to the external magnetic fields requires that the z-component of the biasing magnetic field is the same for all magnetoresistive sensor elements 221, 222, 223 and 224. This holds for all configurations where the magnetoresistive sensor arrangement 220 (e.g. an AMR die) is attached to the center of the side face of the biasing magnet face. However, in order to get a maximum sensitivity it is best to place the magnetoresistive sensor elements 223 and 224 as close as possible to the soft magnetic wheel, and therefore to the edge of the biasing magnet. Such a configuration of the biasing magnet and the magnetoresistive sensor arrangement attached thereto is shown in a perspective view in FIG. 5.

In case the magnetoresistive sensor arrangement 220 is placed at the side face of the biasing magnet 510 off center, the above mentioned condition according to which the z-component of the biasing magnetic field is equal for all magnetoresistive sensor elements 221, 222, 223, 224 can be fulfilled if the magnetization 512 of the biasing magnet 510 is not oriented exactly parallel to the z-axis but is oriented within the x-z plane. Thereby, the x-component of the magnetization 512 makes sure that the z-component of the biasing magnetic field stays the same for all magnetoresistive sensor elements 221, 222, 223, 224. Further, the stabilizing component of the biasing magnet 510 gets smaller thus making the respective magnetic field sensor system more sensitive.

For the described magnetic field sensor system the signal strength will become larger, the larger the difference gets between the y-component of the magnetic field of the soft magnetic wheel at positions (a) of the magnetoresistive sensor elements 223, 224 on one side and (b) of the magnetoresistive sensor elements 221, 222 on the other side. Ideally the y-component of the magnetic field of the passive soft magnetic wheel is zero at the positions of the lower magnetoresistive sensor elements 221, 222. In this case the sensitivity of the magnetic field sensor system is maximal. However, in reality the magnetic field difference of the y-component between the positions of the upper magnetoresistive sensor elements 223, 224 and the positions of the lower magnetoresistive sensor elements 221, 222 depends (among others) on the size of the magnetoresistive sensor arrangement 220 respectively on the size of the corresponding semiconductor die carrying the magnetoresistive sensor elements 221, 222, 223, 224.

In order to get a better knowledge about the influence of the size of the magnetoresistive sensor arrangement 220 the inventors performed two-dimensional FEM simulations of the spatial decay of the y-component of the magnetic field produced by the soft magnetic wheel along the z-axis. Thereby, it has been assumed that the distance between the upper magnetoresistive sensor elements 223, 224 and the lower magnetoresistive sensor elements 221, 222 is 1.5 mm. This is a typical size for a differential magnetic field sensor system.

Figure 6A:
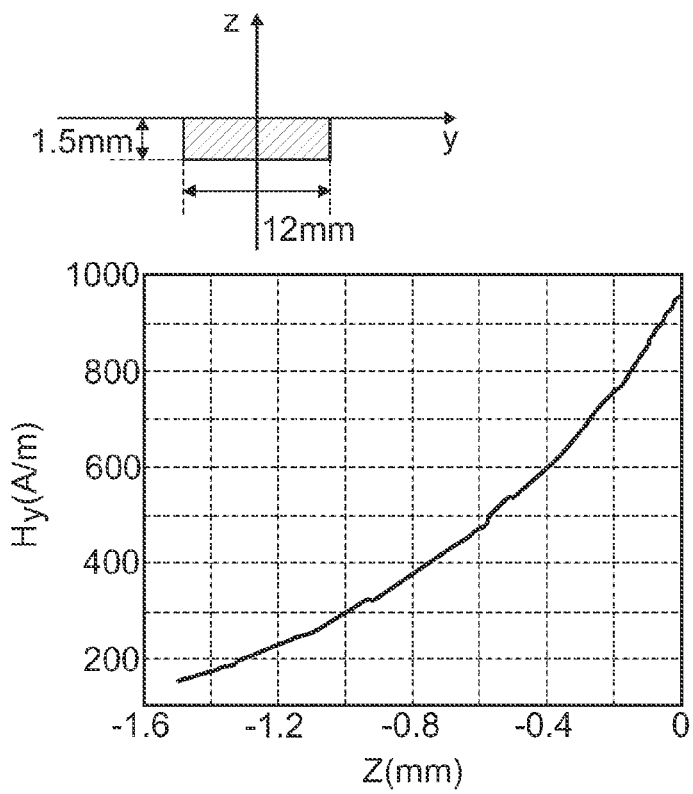
FIGS. 6a and 6b show for two geometries of the biasing magnet the spatial decay of the y-component of the magnetic field produced by the magnetic wheel along the z-axis.
Figure 6B:
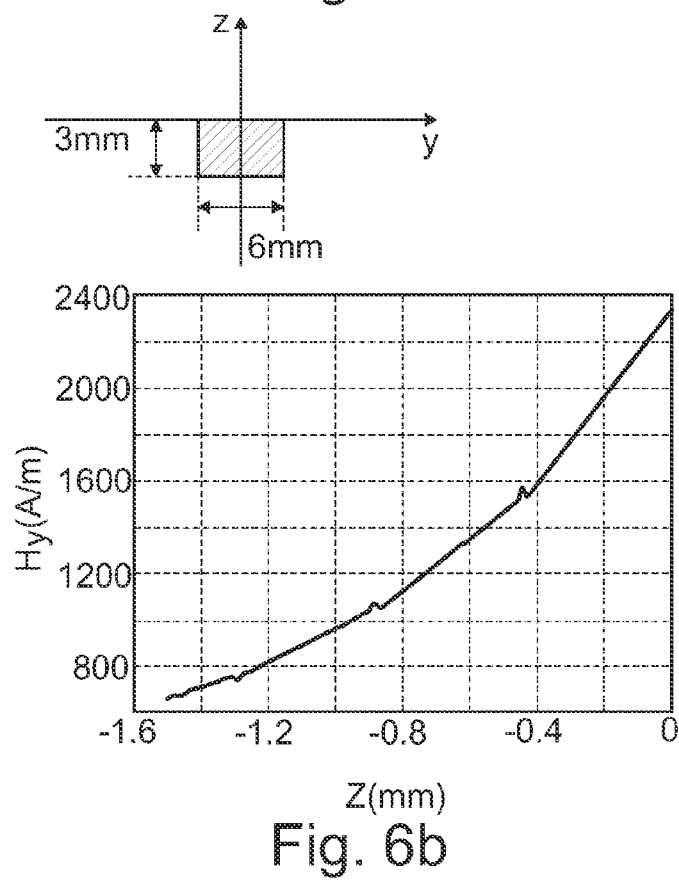

FIGS. 6a and 6b show the corresponding simulation results for two geometries of the biasing magnet. FIG. 6a shows the result for a biasing magnet with the dimensions 12 mm×1.5 mm. It can be seen that the y-component of the magnetic field produced by the soft magnetic wheel is more than 6 times smaller at the positions of the lower magnetoresistive sensor elements 221 and 222 as compared to the positions of the upper magnetoresistive sensor elements 223 and 224. FIG. 6b shows the result for a biasing magnet with the dimensions 6 mm×3 mm. The y-component of the magnetic field produced by the soft magnetic wheel is stronger and it declines more than 3 times over the 1.5 mm distance between (a) the upper magnetoresistive sensor elements 223 and 224 and (b) the lower magnetoresistive sensor elements 221 and 222.

However, in reality, the spatial decay of the y-component of the magnetic field produced by the soft magnetic wheel is much stronger since the mentioned FEM simulations are only two-dimensional and correspondingly assume that the biasing magnet and the soft magnetic wheel are infinite in the third dimension (here the x-direction).

However, one can translate the spatial decay of the y-component of the magnetic field produced by the soft magnetic wheel to the ratio between (a) the sensitivity of the differential sensors described in this document and (b) the sensitivity of a corresponding conventional speed sensor (see FIG. 1).

Figure 7:
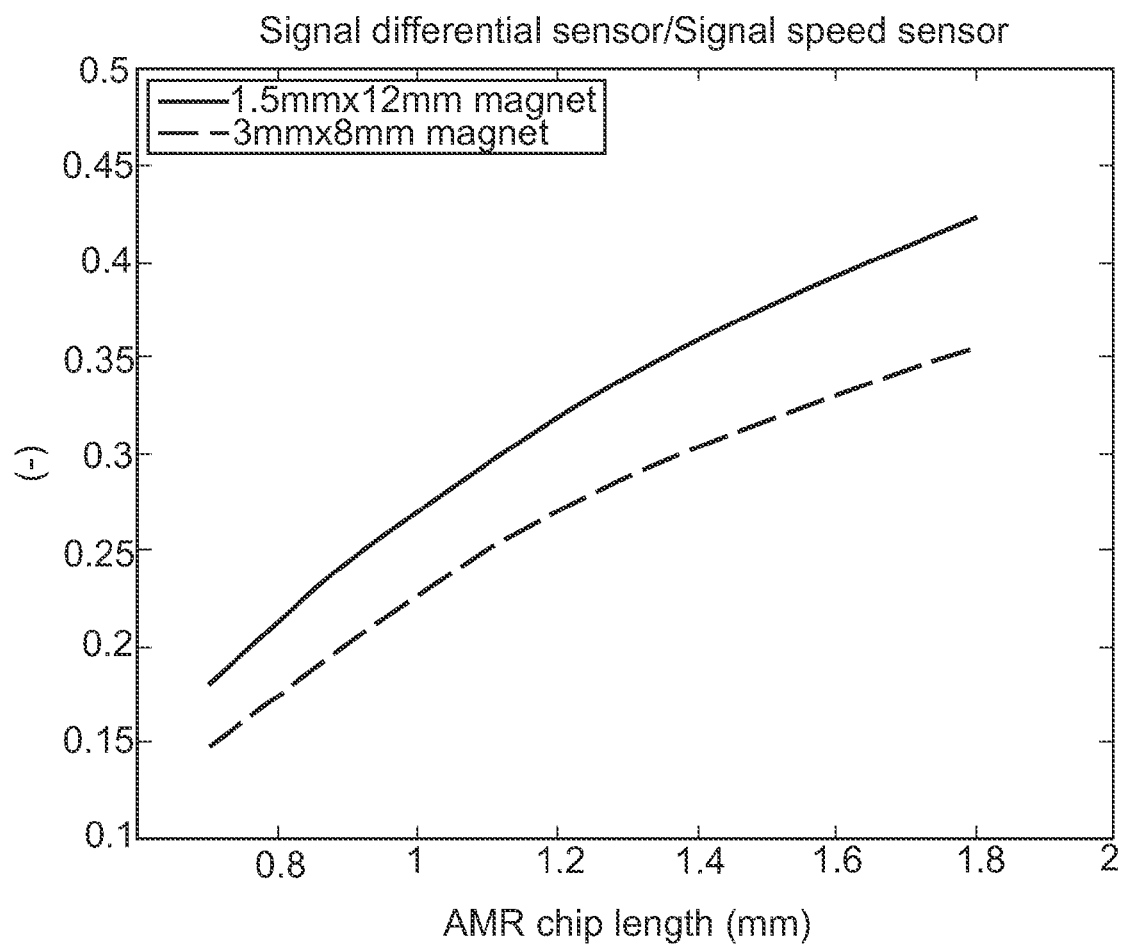
FIG. 7 shows the ratio between (a) the sensitivity of the magnetic field sensor systems (differential sensor) described in this document and (b) the sensitivity of a speed sensor as a function of the length of the chip carrying the magnetoresistive sensor elements.

FIG. 7 shows the corresponding results. As one can see on the FIG. 7, the sensitivity of the differential sensors described in this document increases with the size of the magnetoresistive sensor arrangement along the z-axis. In FIG. 7 this size is denominated AMR chip length. In case of a biasing magnet with dimensions 1.5 mm×12 mm and a sensor length along the z-axis of 1.8 mm, the sensitivity of the differential sensor gets almost half with respect to the sensitivity of a corresponding speed sensor. This means that the sensitivity of the differential sensor described in this document is 3.5-4.5 mV/V for 1 mm air gap and 1.0-1.3 mV/V for 2 mm air gap. In this respect the air gap is the distance between (a) the soft magnetic wheel and (b) the surface of the biasing magnet and/or the magnetoresistive sensor arrangement, which surface is closest to the magnetic wheel.

In order to recapitulate the above described embodiments of the present invention one can conclude: In this document there is described a magnetic field sensor system that has zero output in symmetrical positions of the soft magnetic wheel, that is very robust against external magnetic fields, and that is very sensitive. Ideally the described magnetic field sensor system should be only twice less sensitive then a corresponding speed sensor. This is a very good result for a sensor concept which is highly immune to external magnetic fields.

The described magnetic field sensor system can be realized with hall sensor elements or with magnetoresistive sensor elements such as e.g. AMR, GMR and/or TMR sensor elements.

It should be noted that the term "comprising" does not exclude other elements or steps and "a" or "an" does not exclude a plurality. Also elements described in association with different embodiments may be combined. It should also

REFERENCE NUMERALS 100 magnetic field sensor system
110 biasing magnet
120 magnetoresistive sensor arrangement
121 magnetoresistive sensor element
122 magnetoresistive sensor element
123 magnetoresistive sensor element
124 magnetoresistive sensor element
126 first power supply terminal
130 encoded soft magnetic wheel
131 tooth/teeth
132 gap
H biasing magnetic field
F rotational motion coordinate/direction of rotational of shaft
x x-axis/x-direction
y y-axis/y-direction
z z-axis/z-direction
UA output signal
UB first power supply potential
M second power supply potential
200 magnetic field sensor system
210 biasing magnet
212 magnetization/direction of magnetization
220 magnetoresistive sensor arrangement
221 magnetoresistive sensor element
222 magnetoresistive sensor element
223 magnetoresistive sensor element
224 magnetoresistive sensor element
230 encoded soft magnetic wheel
231 tooth/teeth
232 gap
510 biasing magnet
512 magnetization/direction of magnetization

The invention claimed is:

1. A magnetic field sensor system configured to measure rotational movements of a shaft, the magnetic field sensor system comprising:
a biasing magnet configured to generate a biasing magnetic field;
a magnetic wheel having a wheel axis and a circumferential surface which comprises a regular structure of teeth and gaps arranged in an alternating manner, wherein the magnetic wheel is attachable to the shaft and can be magnetized by the biasing magnetic field; and
a magnetic sensor arrangement comprising four magnetic sensor elements being connected with each other in a differential Wheatstone bridge, wherein two of the four magnetic sensor elements are respectively assigned to each half bridge of the differential Wheatstone bridge configured to measure a difference between y-components of magnetic fields for each half bridge, the four magnetic sensor elements are arranged within an y-z plane, an x-axis, a y-axis and a z-axis define an orthogonal Cartesian coordinate system in which the x-axis is oriented parallel with the wheel axis of the magnetic wheel, the y-axis is oriented tangential to the circumferential surface of the magnetic wheel, the z-axis is a symmetry line through a center of the biasing magnet and a center of the magnetic wheel, and each of the four magnetic sensor elements has a barber pole structure forming an angle of substantially 45° with respect to the z-axis.

2. The magnetic field sensor system as set forth in claim 1, wherein the four magnetic sensor elements are oriented in such a manner that a first and a second one of the four magnetic sensor elements are located at a first distance from the magnetic wheel and a third and a fourth one of the four magnetic sensor elements are located at a second distance from the magnetic wheel, wherein the first distance is larger than the second distance.

3. The magnetic field sensor system as set forth in claim 1, wherein the four magnetic sensor elements are formed on a single substrate die.

4. The magnetic field sensor system as set forth in claim 1, wherein the four magnetic sensor elements occupy an area smaller than 4 mm$^2$.

5. The magnetic field sensor system as set forth in claim 4, wherein the four magnetic sensor elements occupy an area smaller than 2 mm$^2$.

6. The magnetic field sensor system as set forth in claim 5, wherein the four magnetic sensor elements occupy an area smaller than 1 mm$^2$.

7. The magnetic field sensor system as set forth in claim 1, wherein a direction of magnetization of the biasing magnet is oriented parallel to an x-z plane.

8. The magnetic field sensor system as set forth in claim 1, wherein the biasing magnet has a side face being oriented perpendicular to the x-axis and the four magnetic sensor elements are placed at the side face of the biasing magnet.

9. The magnetic field sensor system as set forth in a claim 1, wherein the four magnetic sensor elements are magnetoresistive sensor elements and the magnetic sensor arrangement is a magnetoresistive sensor arrangement.

10. The magnetic field sensor system as set forth in claim 9, wherein the four magnetic sensor elements are oriented in such a manner that their easy axis of magnetization is oriented parallel to a direction of the biasing magnetic field.

11. The magnetic field sensor system as set forth in claim 9, wherein the four magnetic sensor elements experience an identical z-component of the biasing magnetic field.

12. The magnetic field sensor system as set forth in claim 9, wherein the magnetoresistive sensor arrangement is located at a center of a side face of the biasing magnet.

13. The magnetic field sensor system as set forth in claim 9, wherein the magnetoresistive sensor arrangement is located offset of a center of a side face of the biasing magnet.

14. The magnetic field sensor system as set forth in claim 9, wherein a direction of magnetization of the biasing magnet is oriented within an x-z plane, wherein an x-component of the magnetization is larger than zero.

15. The magnetic field sensor system as set forth in claim 1, wherein a direction of magnetization of the biasing magnet is oriented exclusively parallel to the z-axis.

16. The magnetic field sensor system as set forth in the claim 1, wherein an easy axis of magnetization of the four magnetic sensor elements is oriented exclusively parallel to a direction of magnetization of the biasing magnet.

* * * * *